US012593710B2

(12) United States Patent
Williamson et al.

(10) Patent No.: US 12,593,710 B2
(45) Date of Patent: Mar. 31, 2026

(54) PACKAGE SUBSTRATE HAVING POROUS DIELECTRIC LAYER

(71) Applicant: Texas Instruments Incorporated, Dallas, TX (US)

(72) Inventors: Jaimal Mallory Williamson, McKinney, TX (US); Jim C. Lo, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/648,599

(22) Filed: Apr. 29, 2024

(65) Prior Publication Data

US 2024/0282693 A1 Aug. 22, 2024

Related U.S. Application Data

(62) Division of application No. 17/506,156, filed on Oct. 20, 2021, now Pat. No. 11,973,017.

(51) Int. Cl.
| | |
|---|---|
| *H01L 23/498* | (2006.01) |
| *H01L 21/48* | (2006.01) |
| *H01L 23/00* | (2006.01) |
| *H01L 23/31* | (2006.01) |

(52) U.S. Cl.
CPC .... *H01L 23/49894* (2013.01); *H01L 21/4857* (2013.01); *H01L 23/3121* (2013.01); *H01L 23/49816* (2013.01); *H01L 23/49822*

(2013.01); *H01L 24/08* (2013.01); *H01L 24/16* (2013.01); *H01L 2224/08235* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 11,482,480 B2 * | 10/2022 | Yen | ..................... | H01L 23/3114 |
| 2004/0038021 A1 | 2/2004 | Nagai et al. | | |
| 2018/0366411 A1 * | 12/2018 | Suk | .......................... | H01L 24/19 |
| 2021/0111128 A1 * | 4/2021 | Suk | ..................... | H01L 23/3114 |
| 2022/0310449 A1 * | 9/2022 | Kuang | ................ | H01L 25/0657 |
| 2023/0109868 A1 * | 4/2023 | Huang | .............. | H01L 21/76834 |
| | | | | 257/751 |
| 2023/0118218 A1 | 4/2023 | Williamson | | |

FOREIGN PATENT DOCUMENTS

| | | | |
|---|---|---|---|
| KR | 20170043427 | * | 4/2017 |

* cited by examiner

*Primary Examiner* — Long Pham
(74) *Attorney, Agent, or Firm* — Xiaotun Qiu; Frank D. Cimino

(57) ABSTRACT

A method of making a multilayer package substrate includes forming a plurality of dielectric layers including a top dielectric layer on a top side and a bottom dielectric layer on a bottom side. A top patterned metal layer is on the top dielectric layer and a bottom patterned metal layer is on the bottom dielectric layer. At least one of the top dielectric layer and the bottom dielectric layer is a porous dielectric layer having a plurality of pores including an average porosity of at least 5% averaged over its thickness.

15 Claims, 5 Drawing Sheets

100

TOP
DIELECTRIC
LAYER

118

112a

112

110
CORE

111

111a

116
BOTTOM
DIELECTRIC
LAYER

152

151

TOP
DIELECTRIC
LAYER

118

112a

112

100

110
CORE

111

111a

116
BOTTOM
DIELECTRIC
LAYER

100"

100b

PACKAGE SUBSTRATE HAVING POROUS DIELECTRIC LAYER

CROSS-REFERENCE TO RELATED APPLICATIONS

This application is a divisional of co-pending application Ser. No. 17/506,156 filed Oct. 20, 2021, the contents of which are incorporated herein by reference in its entirety.

FIELD

This Disclosure relates to dielectric layer(s) for a multilayer package substrate for a semiconductor package.

BACKGROUND

A variety of semiconductor chip packages are known that provide support for an integrated circuit (IC) die or other semiconductor die and associated bond wires, provide protection from the environment, and enable surface mounting of the die to and interconnection generally with a printed circuit board (PCB). One conventional semiconductor package configuration includes a leadframe having a die pad and wire bond pads, where the semiconductor die is generally mounted with its top (active) side up on the die pad, where the bond pads of the semiconductor die are generally electrically connected to leads of the leadframe using bond wires. A semiconductor die can also be flipchip mounted by generally having solder bumps on the bond pads onto the leads of a leadframe, such as in a flip chip on leadframe (FCOL) device.

Another conventional semiconductor package arrangement comprises a multilayer package substrate which can comprise an organic build-up multilayer package that can have a dielectric core that is built upon, generally on both sides of the core. There are some multilayer package substrate arrangements which do not have a core that also include a plurality of layers, such as a molded interconnect substrate (MIS). One example flipchip package that includes a multilayer package substrate is a flipchip ball grid array (FCBGA) package. For a FCBGA the semiconductor die can be encapsulated by a mold compound or can be sealed by a metallic lid. Another example of a flipchip package is a flipchip Chip Scale Package (FCCSP).

Metal features (contact pads) on the bottom of the multilayer package substrate are generally connected by an electrical connection to underlying circuitry, such as to circuitry on a PCB, e.g., a "motherboard") in the device in which it is employed, using second level interconnects (e.g., pins, solder balls) between the multilayer package substrate and the underlying circuit. The second level interconnects generally have a greater pitch as compared to the flipchip interconnects, so that the routing on the package substrate conventionally "fans out".

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize due to the presence of adjacent metal lines that are operated at a different voltage for a semiconductor package that utilizes a multilayer package substrate (e.g., a MIS), a performance issue can be crosstalk due to capacitive and inductive coupling through the dielectric layer(s), particularly for high-frequency operation. For example, such coupling can be an issue for transmission lines that provide a connection to antenna(s) that can be on a top side of the multilayer package substrate. Disclosed porous dielectric layers for multilayer package substrates reduce the crosstalk due to capacitive and inductive coupling between adjacent metal lines by lowering the dielectric constant of the dielectric layer which comprises a polymeric dielectric material, for at least one of the dielectric layers of the multilayer package substrate. The lowering of the dielectric constant is implemented by the porous dielectric layer having a significant level of porosity, including a plurality of pores providing an average porosity of at least 5% over the thickness of the porous dielectric layer.

Disclosed aspects include a multilayer package substrate including a plurality of dielectric layers including a top dielectric layer on a top side and a bottom dielectric layer on a bottom side. A top patterned metal layer is on the top dielectric layer and a bottom patterned metal layer is on the bottom dielectric layer. At least one of the top dielectric layer and the bottom dielectric layer comprises a porous dielectric layer having a plurality of pores including an average porosity of at least 5% averaged over its thickness. Disclosed aspects also include a semiconductor package including a multilayer package substrate and an IC die comprising a substrate including a top side semiconductor surface including circuitry having a plurality of bond pads electrically connected to nodes in the circuitry, where the IC die is mounted on the multilayer package substrate or is embedded therein. The plurality of bond pads are electrically connected to the multilayer package substrate.

BRIEF DESCRIPTION OF THE DRAWINGS

Reference will now be made to the accompanying drawings, which are not necessarily drawn to scale, wherein:

FIG. 1B shows results after laminating a polymer capping layer on a sacrificial polymer layer on a top dielectric layer, and FIG. 1C shows results after curing the top dielectric layer and then removing the polymer capping layer to form a disclosed porous dielectric layer. The thickness of the porous dielectric layer can be between 20 μm and 50 μm.

FIG. 2A shows results after laminating a polymer capping layer on the top dielectric layer. FIG. 2B shows results after curing the top dielectric layer and then removing the polymer capping layer to form a disclosed porous dielectric layer.

FIG. 3A shows results after an atomizing process for depositing a sacrificial polymer layer on the top dielectric layer. FIG. 3B shows results after laminating a polymer capping layer later on the sacrificial polymer layer. FIG. 3C shows results after curing the top dielectric layer and then removing the polymer capping layer to form a disclosed porous dielectric layer.

DETAILED DESCRIPTION

Figure 1A:
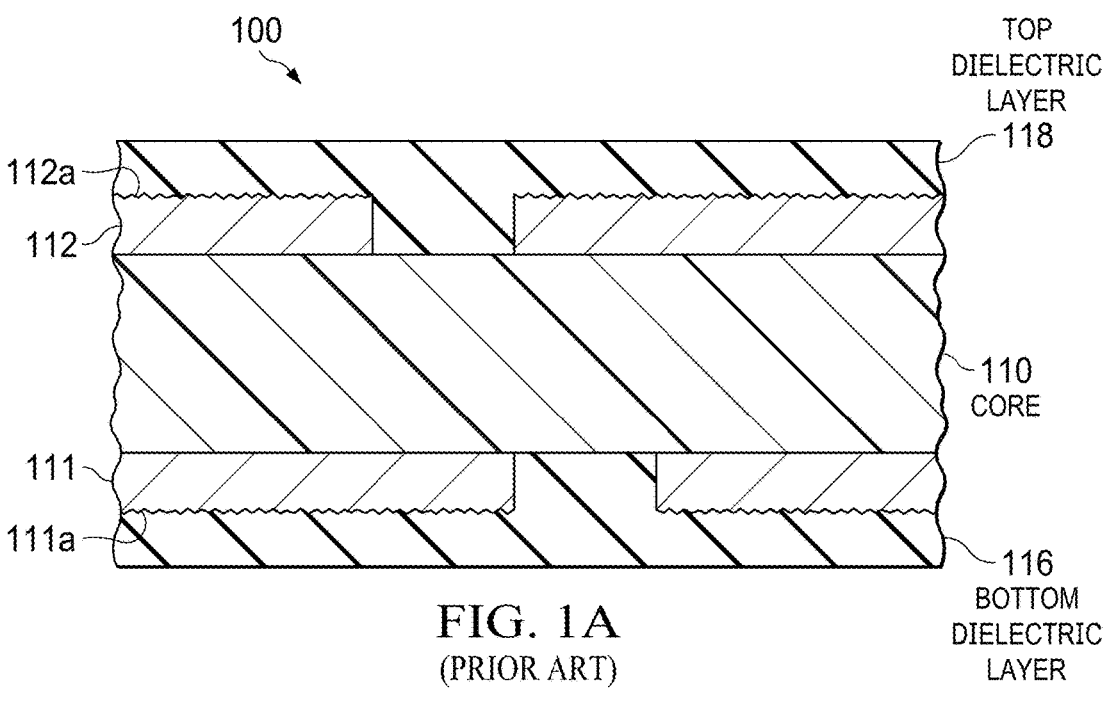
FIG. 1A is a cross-sectional view of in-process multilayer package substrate having a core layer and a top patterned metal layer on a top side of the core layer and a bottom patterned metal layer on a bottom side of the core layer, and a plurality of dielectric layers including a top dielectric layer on the top patterned metal layer and a bottom dielectric layer on the bottom patterned metal layer.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Several terms used herein will now be defined. A multilayer package substrate is a particular package substrate arrangement that comprises a plurality (at least two) of stacked layers where each layer is pre-configured with metal plating such as copper plating or interconnects to provide electrical connections in the package. Such a multilayer package substrate is generally built by forming a dielectric layer such as a mold compound or an epoxy material such as marketed as an Ajinomoto build up film (ABF) or other organic compound(s) around an organic substrate comprising a metal material between a patterned top metal layer and a patterned metal bottom layer. Such multilevel package substrates can be used for single- or multi-die configurations, both lateral and vertically stacked, enabling low-profile, fine-pitch packages, which enable different stackups, material, and manufacturing process, that has recognized benefits when applied to a semiconductor package as described below.

An antenna as used herein in the particular case the semiconductor package comprises an AIP that comprises a metal comprising a structure which is configured to provide an interface between radio waves propagating through free-space and electric currents that flow in the metal conductor of a package substrate, where the antenna is coupled for use with a transmitter and/or a receiver.

An IC die as used herein comprises a substrate having at least a semiconductor surface (generally an all-semiconductor substrate, such as comprising silicon having an optional epitaxial layer thereon), where there are circuit elements (including transistors, and generally diodes, resistors, capacitors, etc.) formed in the semiconductor surface that are configured together for generally realizing at least one circuit function. Various nodes of the circuitry are coupled to bond pads on the topside of the IC, where the bond pads generally comprise the top layer metal. In the case of an AIP, the IC(s) generally include at least a radio frequency (RF) IC.

As used herein, the term a "porous dielectric layer" refers to a disclosed dielectric layer having at least a 5% average porosity throughout its thickness. The pore size is generally in a distribution of pore sizes having a largest pore size ratio to a smallest pore size of at least two, where the largest pore size is generally less than 5 μm. All pores can be nanosize. One known way to measure the porosity of a layer is to measure the pore volume by sealing the sample to be measured in a pressure vessel, decreasing the pressure by a known amount, and measuring the increase in volume of the contained gas. Conversely, the grain (solid) volume can be measured and, if the bulk volume of the layer sample is known, the % porosity can be determined. A porometer is known to be one instrument for measuring the porosity of a sample.

As used herein, the term curing" refers to a chemical process employed in polymer chemistry and process engineering that produces the toughening or hardening of a polymer material by generally heating the polymer material to a sufficient temperature to result in cross-linking between chains of the polymer. Following the curing process the polymer layer is referred to herein as being a cured polymer layer.

Disclosed aspects include methods for forming at least one disclosed porous dielectric polymer layer for a multilayer package substrate that generally comprises an organic polymer layer using a sacrificial polymer material that has a thermal degradation temperature (also known as a thermal decomposition temperature) that is lower than the thermal degradation temperature of the dielectric polymer layer. The dielectric polymer layer is made porous during a curing step by vapors generated by thermal decomposition of the sacrificial polymer material that flow into dielectric polymer layer which results in the formation of a porous and cured dielectric layer.

Disclosed aspects utilize the thermal degradation of organic polymers that are termed herein sacrificial polymer materials. Thermal degradation of organic polymers is sometimes also referred to as thermal decomposition, which results in a mass decrease of the polymer due to the production of gaseous products such as carbon monoxide, water vapor and carbon dioxide. The gaseous products result in the formation of pores in the polymer layer which may be formed from curing a dielectric polymer layer used for any of the various dielectric layers of a multilevel package substrate, typically being a build-up dielectric polymer layer.

Organic build-up package substrates, including disclosed multilayer package substrates, are generally formed from a core layer (or core or core substrate, or pre-preg layer) with a build-up laminate of metal and dielectric layers generally provided on both sides of the core layer, as is known in the art. The core layer material is generally a fiber reinforced epoxy resin, typically comprising bismaleimide triazine (BT) or FR-4 embedded with glass fibers. The core layer can have internal circuitry and may have incorporated metal layers. Core layers with two incorporated metal layers thereon, one on each side, are common. Cores may also have four metal layers, or more.

As known in the art of polymer science, thermal degradation refers to a type of polymer degradation process where damaging chemical changes to the polymer structure take place at elevated temperatures, without the simultaneous involvement of other reaction compounds such as oxygen. Even in the absence of air which provides an oxygen ($O_2$) source, polymers such as certain organic polymers can begin to degrade, and as a result generate gaseous products if heated to a temperature high enough. Thermal degradation is distinct from thermal-oxidation, where thermal oxidation can usually take place at less elevated (lower) temperatures. Thermogravimetric analysis (TGA), which refers to the techniques where a sample is heated in a controlled atmosphere at a defined heating rate whilst the sample's mass is measured, can be used as an analytic technique to select an appropriate temperature for the thermal degradation of a particular polymer. TGA can be used to show degradation properties of a sacrificial polymer material that can enable selection of a suitable sacrificial polymer material.

Disclosed methods are generally implemented as a substrate panel (or sheet) level method that features a sacrificial polymer material for lowering the dielectric constant of at least one dielectric layer of a multilayer package substrate. For example, the dielectric layer can comprise ABF which is a commonly used commercially available epoxy-based dielectric polymer material having a reported dielectric constant (εr) of 3.1-3.3 with a loss tangent of 0.012. Disclosed methods are compatible with existing manufacturing/assembly processes for generating multilevel package substrates.

Below are described three different example methods for forming a disclosed porous dielectric layer using a sacrificial polymer material for at least one dielectric layer of a multilayer package substrate. Although not shown, as described above, multiple ones of the package substrates can be processed together in a substrate panel or sheet, which then can be singulated to separate into individual multilayer package substrate units using, for example, mechanical sawing.

FIG. 1A is a cross-sectional view of in-process multilayer package substrate 100 unit having a core layer 110 and a top patterned metal layer 112 on a top side of the core layer 110, and a bottom patterned metal layer 111 on a bottom side of the core layer 110. The respective patterned metal layers 112, 111 can comprise copper and each include a roughened surface shown as 112a and 111a, respectively. The roughened surfaces 112a, 111a are used to promote adhesion between the respective dielectric layers and the respective patterned metal layers, such as between ABF and copper. This roughening pretreatment to form the roughened surfaces 112a, 111a can utilize what is sold commercially as a CZ chemical from MEC Co, LTD.

There are a plurality of dielectric layers including a top dielectric layer 118 on the top patterned metal layer 112, and a bottom dielectric layer 116 on the bottom patterned metal layer 111. Each of the three different disclosed example methods described below for forming a disclosed porous dielectric polymer layer for at least one dielectric layer of a multilayer package substrate using a sacrificial polymer material generally start with the same in-process multilayer package substrate 100 shown in FIG. 1A, or a slight variant thereof, which is marked as being prior art.

Figure 1B:
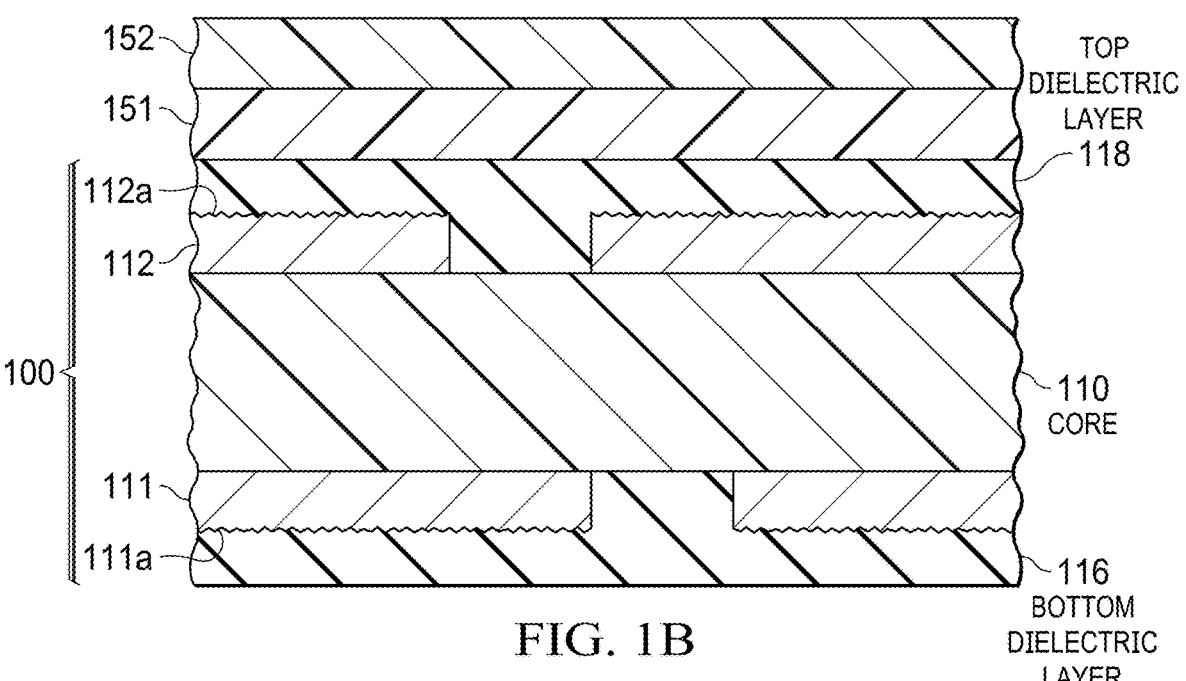
FIGS. 1B-C are successive cross-sectional views of an in-process multilevel package substrate corresponding to results following steps in a first example method for forming a multilevel package substrate including at least one porous dielectric layer, according to an example aspect.
Figure 1C:
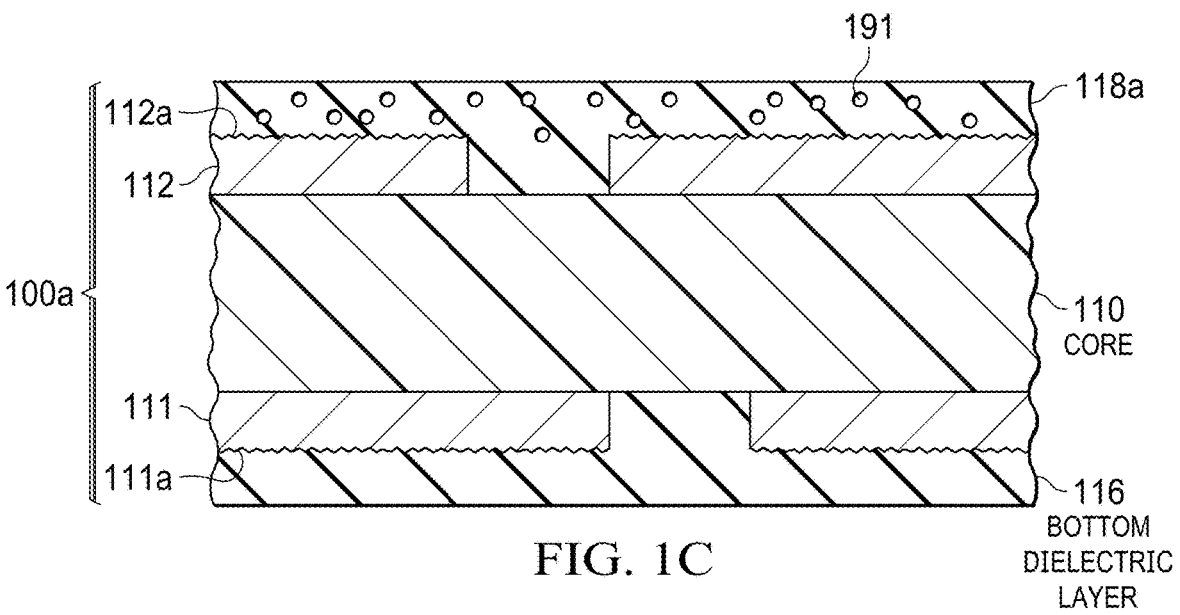

FIGS. 1B-C are successive cross-sectional views of an in-process multilevel package substrate corresponding to results following steps in a first example method for forming a multilevel package substrate including at least one porous dielectric layer, starting with the in-process multilayer package substrate 100 shown in FIG. 1A, a according to an example aspect. Between the roughening pretreatment to form the roughened surfaces 112a, 111a and the formation of the respective dielectric layers 116 and 118 a baking step can optionally be added to implement drying to help remove moisture, generally being performed at temperature of about 100° C.

FIG. 1B shows results for the resulting multilayer package substrate 100 after laminating a polymer capping layer 152 on a sacrificial polymer layer 151 that is on the top dielectric layer 118. The polymer capping layer functions both as a protective layer for the sacrificial polymer layer 151. The sacrificial polymer layer 151 generally has an average molecular weight in a range from 300 to 2,000 g/mole. The polymer capping layer 152 can comprise a polyethylene terephthalate (PET) film. More generally the polymer capping layer 152 comprises a material that has an affinity (a stickiness) for adhesion to the top dielectric layer 118. Although not shown, the same sacrificial polymer material 151 attached to a polymer capping layer 152 that has an affinity for the bottom dielectric layer 116 can also optionally simultaneously be utilized for the bottom dielectric layer 116 on the bottom side of the in-process multilayer package substrate.

For example, the sacrificial polymer layer 151 can comprise polycaprolactone disclosed above, while other examples of sacrificial polymers materials include polypropylene oxide, and p-toluene semicarbazide. The polymer capping layer 152 besides being a PET film 152, such as a MYLAR film (also known as BoPET (Biaxially-oriented PET) which is a polyester film made from stretched PET, can be another film material that has an affinity to the chemistry of the dielectric layer being processed, and this example being top dielectric layer 118, such as ABF. This 2-layer film stack 152/151 can be laminated with the sacrificial polymer layer 151 side down onto the top dielectric layer 118. The lamination step can be performed under conditions that partially cure the top dielectric layer 118.

FIG. 1C shows the resulting multilayer package substrate shown as 100a after a curing step to decompose the sacrificial polymer layer 151 which results in forming pores 191 in the top dielectric layer to provide a porous dielectric layer shown as 118a, and then removing the polymer capping layer 152. Because of the decomposition of the sacrificial polymer material during the curing, the sacrificial polymer layer 151 disappears so that only the polymer capping layer 152 is removed. A post-baking process can follow the polymer capping layer 152 removal. A singulation step, can follow the post-baking step, to process a substrate sheet (or panel) comprising a plurality of multilateral substrate units to produce a plurality of disclosed multilevel package substrate units, where a mechanical saw is generally used for the singulation step.

Figure 2A:
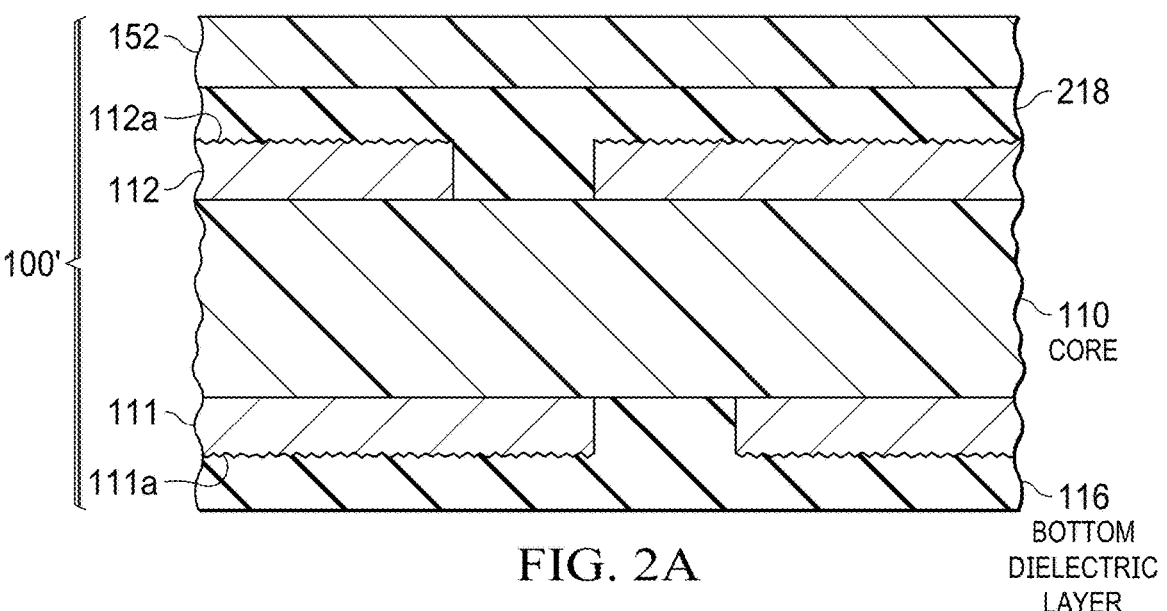
FIGS. 2A-B are successive cross-sectional views of an in-process multilevel package substrate corresponding to results following steps in a second example method for forming a multilevel package substrate including at least one porous dielectric layer, according to an example aspect. In this method the top dielectric layer for the in-process multilayer package substrate 100 shown in FIG. 1A is modified to be formed to include a sacrificial polymer material blended therein.
Figure 2B:
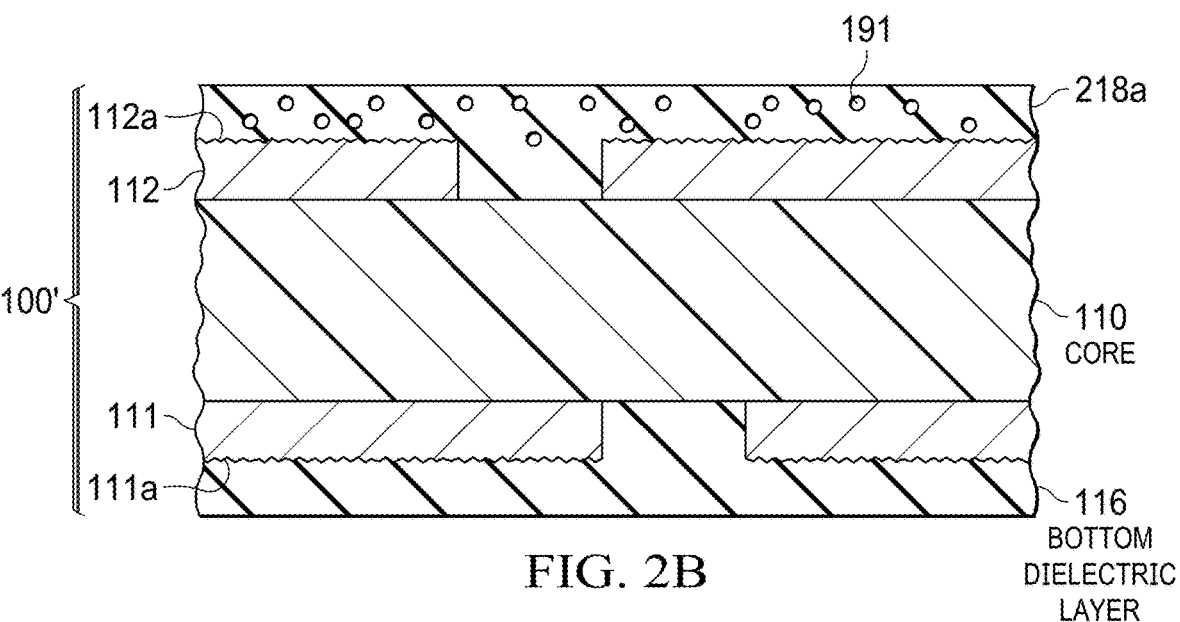

FIGS. 2A-B are successive cross-sectional views of an in-process multilevel package substrate 100' corresponding to results following steps in a second example method for forming a multilevel package substrate including at least one porous dielectric layer, according to an example aspect. In this method the top dielectric layer for the in-process multilayer package substrate 100 in FIG. 1A is modified to include a sacrificial polymer material blended therein, which is now shown as top dielectric layer 218 of the multilevel package substrate 100'. Regarding the blending process, a sacrificial polymer can be mixed in a matrix polymer resin film such as ABF. Weight percentages on the order of less than or equal to 10 percent of the sacrificial polymer blended into the matrix polymer resin can be based upon pore size control and limiting of the phase separation. The sacrificial polymer material is generally designed to decompose completely from the matrix polymer resin during cure of the matrix polymer resin. FIG. 2A shows results for the in-process multilevel package substrate 100' after laminating a polymer capping layer 152 on the top dielectric layer 218. As described above the sacrificial polymer material can begin initial degradation during the lamination process when lamination process includes both heat and pressure. FIG. 2B shows the results for the in-process multilevel package substrate 100' after a curing process, where the sacrificial polymer material decomposes during the top dielectric precursor layer cure to form pores 191 in the resulting top dielectric layer shown as 218a, where the pores 191 are generally nano-sized pores having a range of pore sizes, typically having a range of largest to smallest pores of at least a factor of 2.

Figure 3A:
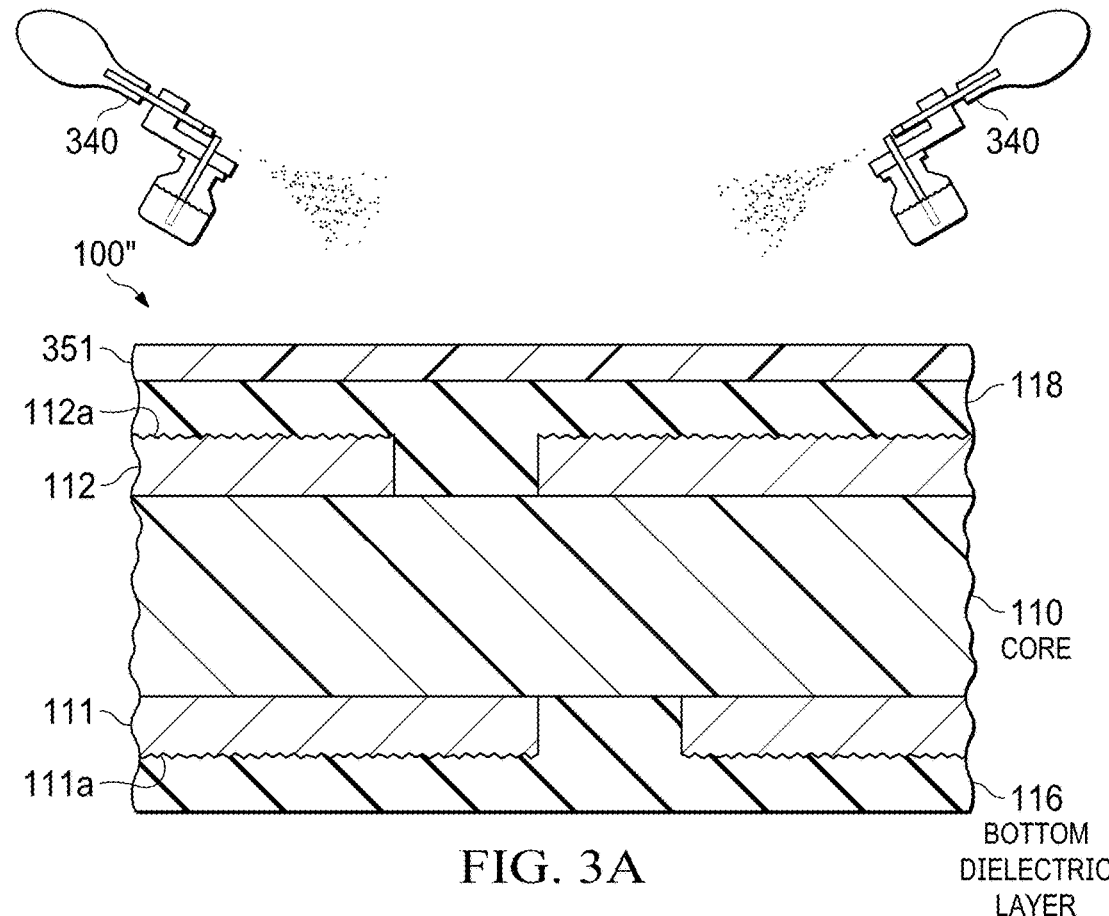
FIGS. 3A-C are successive views of an in-process multilevel package substrate corresponding to results following steps in a third example method for forming a multilevel package substrate including at least one porous dielectric layer, according to an example aspect. In this method the in-process multilayer package substrate in FIG. 1A is utilized.
Figure 3B:
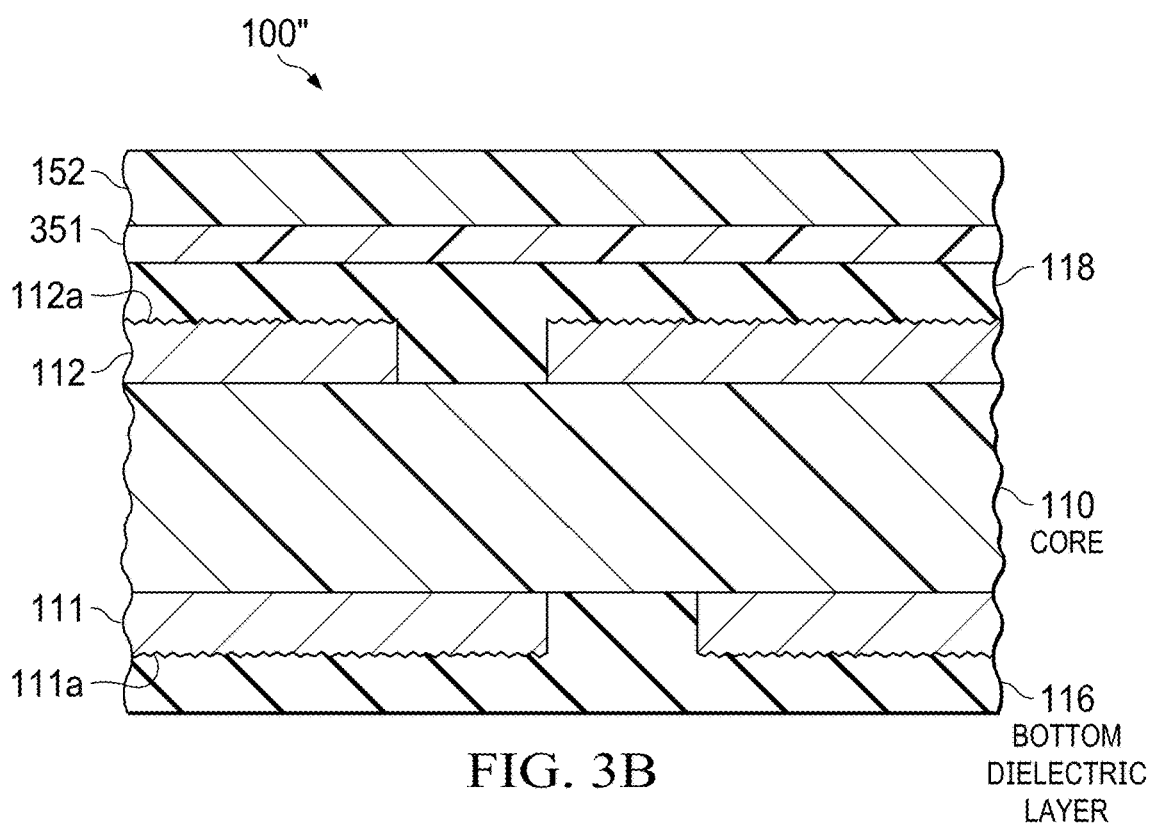
Figure 3C:
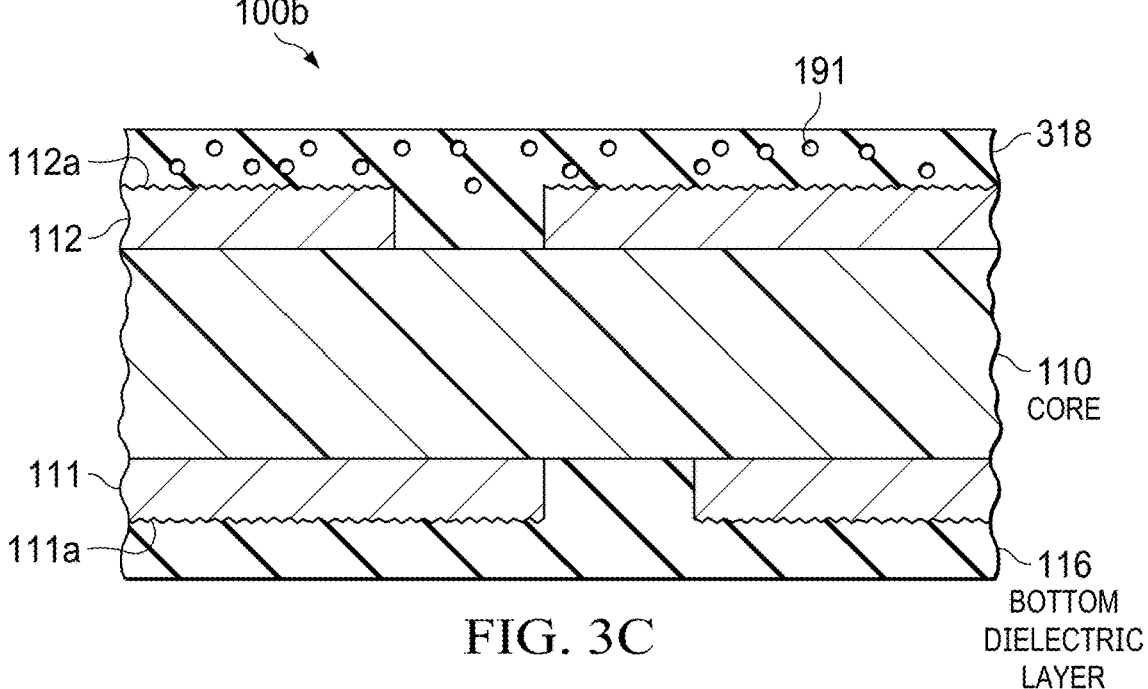

FIGS. 3A-C are successive views of an in-process multilevel package substrate 100" corresponding to results following steps in a third example method for forming a multilevel package substrate including at least one porous dielectric layer, according to an example aspect. In this method the in-process multilayer package substrate 100 shown in FIG. 1A is utilized. FIG. 3A shows results for the in-process multilevel package substrate 100" after an atomizing process using the atomizers shown as 340 for depositing a sacrificial polymer layer 351 on the top dielectric layer 118. FIG. 3B shows results for the in-process multilevel package substrate 100" after laminating a polymer capping layer 152 on the top dielectric layer 118.

The gases from the partial decomposition of the sacrificial polymer material can flow into the top dielectric layer 118 during this PET layer 152 lamination process which can provide some curing, thus although not shown, may form some pores in the top dielectric layer 118. FIG. 3C shows the results for the in-process multilevel package substrate now shown as 100b after a curing process, where the material of the sacrificial polymer layer 351 shown in FIG. 3B decomposes entirely leaving pores 191 in the resulting top dielectric layer now shown as 318, where the pores 191 as described above are generally all nano-sized pores, followed by the removing of the polymer capping layer 152.

One example application for disclosed multilevel package substrates having at least one porous dielectric layer is to meet high frequency and speed signal transmission needs for IC applications including 5G, where a disclosed porous dielectric layer can be used as the antenna dielectric layer, and also one or more of the dielectric layers associated with the transmission line connected to the antenna itself. This example application recognizes the electrical performance of semiconductor packages such as AIPs can be adversely impacted by transmission delays between adjacent metal interconnects that are separated by a dielectric layer.

Figures 4, 5:
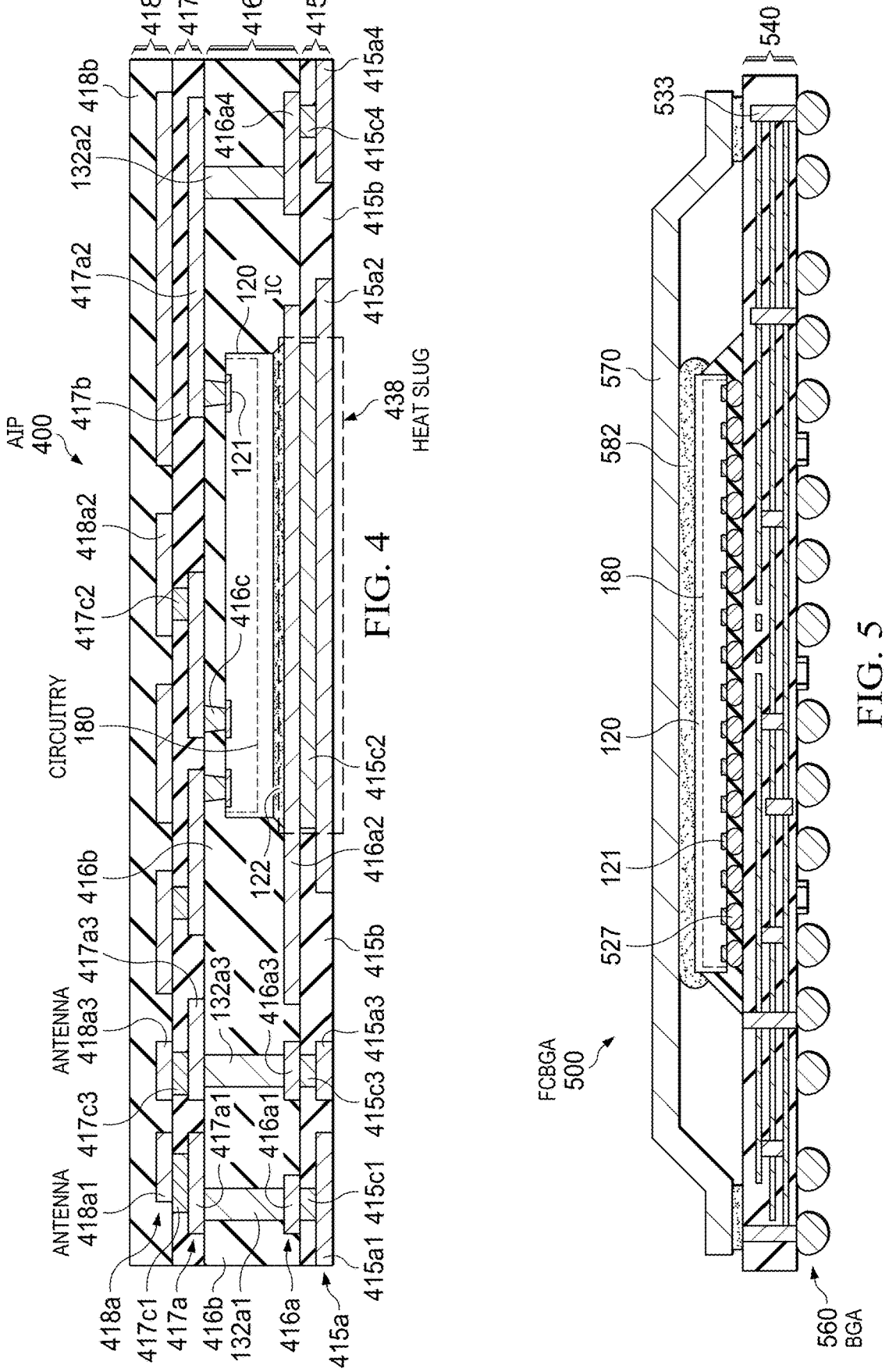
FIG. 4 is a cross-sectional view of example antenna in package (AIP) comprising a multilayer package substrate having four layers shown being layer 4 (the top layer) that provides both a first antenna and an optional second antenna, where layer 4 is on layer 3, layer 3 is on layer 2 (which includes an IC that is attached top side up) that is on layer 1 (the bottom layer), where at least one of the respective dielectric layers comprises a disclosed porous dielectric layer, according to an example aspect.
FIG. 5 is a cross-sectional view of an example FCBGA package having at least one disclosed porous dielectric layer, according to an example aspect.

FIG. 4 is a cross-sectional depiction of an example AIP 400 comprising a multilayer package substrate having four layers shown as layer 4 418 (top layer) on layer 3 417, with layer 3 on layer 2 416, which is on layer 1 415 (bottom layer). Layer 4 418 comprises a metal layer 418a that includes at least one antenna shown by example as antennas 418a1 and 418a3, metal traces 418a2, and a dielectric layer 418b. At least one of the dielectric layers for the AIP 400 includes a disclosed porous dielectric layer. Optionally, all of the dielectric layers for the AIP 400 can be disclosed porous dielectric layers. Although not shown in the view provided of AIP 400 the dielectric layer 418b can optionally include apertures to expose the top surface of the antennas 418a1 and 418a3 and/or the metal traces 418a2. Although the antennas 418a1 and 418a3 are shown having the shape of microstrip/patch antennas, the antenna or antennas 418a1 and 418a3 can alternately comprise other types of antennas including a Vivaldi antenna, a horn antenna, a Yagi-Uda antenna, or a bow-tie antenna.

Layer 3 417 comprises a metal layer 417a including metal connectors 417a1 and 417a3 for the respective antennas 418a1 and 418a3, and metal pads 417a2 that as described below provide a portion of the connection to the bond pads 121 connected to selected nodes in the circuitry 180 of the IC 120 which is mounted top side up. Layer 3 417 also includes a dielectric layer 417b. Layer 3 417 comprises filled vias 417c1 and 417c3 that provide a top of the transmission line for the antennas 418a1 and 418a3 as they are positioned directly under the antennas 418a1 and 418a3. There are also filled vias 417c2 that provide a portion of the connection to the bond pads 121 on the top side surface of the IC 120.

Layer 2 416 comprises a metal layer 416a that includes metal layer portion 416a1, and a metal layer portion 416a3, as part of the transmission line for antennas 418a1 and 418a3, respectively, and a metal layer portion referred to as die attach pad 416a2 that is part of the heat slug (or heatsink) 438 under the IC die 120. Metal layer portion 416a4 is part of the connection to the bond pad 121 of the IC die 120. Layer 2 416 also further includes a dielectric layer 416b. Layer 2 416 also includes pillars (such as copper pillars) shown as 132a1 and 132a3 as part of the transmission line for antennas 418a1 and 418a3, respectively, and also a pillar 132a2 as part of the connection to the bond pads 121 of the IC die 120.

Layer 1 415 which can be referred to as a bottom layer comprises a metal layer 415a including a metal layer portion 415a1 and a metal layer portion 415a3 associated with the transmission lines for the antennas 418a1 and 418a3, respectively, metal layer portion 415a2 as part of the heat slug 438, and a metal layer portion 415a4 that is part of the connection to the bond pads 121 of the IC die 120. Layer 1 415 also includes a dielectric layer 415b. Layer 1 415 also comprises filled vias including filled vias 415c1 and 415c3 as part of the transmission line for antennas 418a1 and 418a3, respectively, a filled via area 415c2 that provides a portion of the heat slug 438, and a filled via 415c4 as part of the connection to the bond pads 121 of the IC die 120.

The circuitry 180 on the IC 120 comprises circuit elements (including transistors, and generally diodes, resistors, capacitors, etc.) formed in a substrate comprising at least a top semiconductor layer. For example, the substrate can comprise an epitaxial layer on a bulk substrate material such as silicon.

The bottom side of IC die 120 is attached by a die attach material 122 that is generally both electrically conductive and thermally conductive to the heat slug 438. The IC die 120 is a fully surrounded (or embedded) IC die 120, with the sidewalls of the IC die 120 surrounded by a dielectric layer 416*b* of a bottom intermediate layer 416, except on its topside by the presence of filled vias 416*c* that make electrical contact to the bond pads 121 of the IC die 120.

Generally, any of the above-described dielectric layers can comprise an epoxy material such ABF. The antennas 418*a*1 and 418*a*3 can comprise a millimeter wave antenna, where the millimeter-wave region of the electromagnetic spectrum is commonly defined as the 30 GHz to 300 GHz frequency band, equivalent to the 1 cm to 1 mm wavelength range. The terahertz (THz) band may also be covered by the disclosed antennas. The IC die 120 can comprise a RF IC die, generally comprising a transceiver including low noise amplifiers, mixers, clock generators, power amplifiers. duplexer and passive components (inductor, capacitor, and transformer).

FIG. 5 is a cross-sectional view of an example FCBGA package 500 having at least one disclosed porous dielectric layer for its dielectric layers, according to an example aspect. FCBGA package 500 includes an IC die 120 including circuitry 180 electrically connected to bond pads 121 of an IC die 120 shown flipchip assembled using solder balls 527 that electrically couple the bond pads 121 to pads on a top surface of a multilayer package substrate 540. There are through-vias 533 that connect from a top metal layer of the multilayer package substrate 540 to a bottom metal layer of the multilayer package substrate 540. The multilayer package substrate 540 includes a ball grid array (BGA) 560 on its bottom side. On a top side of the FCBGA package 500 is a lid 570 that generally comprises a metal, where there is an adhesive 582 between the lid 570 and the bottom side of the IC die 120, and between the lid 570 and a top surface of the multilayer package substrate 540.

EXAMPLES

Disclosed aspects are further illustrated by the following specific Examples, which should not be construed as limiting the scope or content of this Disclosure in any way.

This Example provides a proof of concept of the blending a sacrificial material into a polymer matrix for forming air filled pores in polymeric films. The degradation of the sacrificial polymer material can be controlled based on its average molecular weight, chemical functionality, and understanding degradation characteristics to allow diffusion below the glass transition temperature (Tg) of the matrix polymer, generally described above is being ABF, but in this example being a benzocylobutene (BCB) film. There are other considerations that can allow better diffusion of the pores in the polymer matrix including chemical modifications via the use of plasticizer to cause disentanglement of the amorphous polymer chains for improved mobility.

This Example uses a BCB film blended with the polycaprolactone (PCL) as the sacrificial polymer material. The weight ratio is 80 wt. % BCB to 20% PCL (300 g/mole). The dielectric constant of a BCB film is reported to be about 2.65. In this example, adding the sacrificial polymer material to the BCB film lowered the dielectric constant of the resulting porous BCB layer to 2.29, representing a reduction in highlighter constant of about 14%. Lowering the dielectric constant of a dielectric layer is known to increase the signal transmission speed through the dielectric layer.

Disclosed aspects can be integrated into a variety of assembly flows to form a variety of different semiconductor packages having multilayer package substrates and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method, comprising:

forming a multilayer package substrate, comprising:
   forming a core layer;
   forming a top patterned metal layer on a top side of the core layer and a bottom patterned metal layer on a bottom side of the core layer, wherein the top patterned metal layer includes an antenna;
   forming a plurality of dielectric layers including a top dielectric layer on the top patterned metal layer and a bottom dielectric layer on the bottom patterned metal layer, wherein at least one of the plurality of dielectric layers comprises a porous dielectric layer including a plurality of pores; and
   mounting an integrated circuit (IC) die comprising a substrate including a top side semiconductor surface including circuitry having a plurality of bond pads on or within the multilayer package substrate, wherein the plurality of bond pads are electrically connected to the multilayer package substrate.

2. The method of claim 1, wherein the IC die is flipchip mounted on the top patterned metal layer.

3. The method of claim 1, wherein the IC die is embedded within the multilayer package substrate.

4. The method of claim 1, wherein the porous dielectric layer comprises an epoxy material and wherein a thickness of the porous dielectric layer is between 20 μm and 50 μm.

5. The method of claim 1, wherein the plurality of pores include a plurality of nanopores including a size ratio from largest to smallest of at least 2.

6. The method of claim 1, wherein the bottom dielectric layer is a porous layer including a plurality of pores and having an average porosity of at least 5% averaged over its thickness.

7. The method of claim 1, wherein the IC die is embedded within the multilayer package substrate;

wherein the bottom patterned metal layer includes a plurality of contact pads including a first contact pad, and a plurality of filled vias;

the plurality of bond pads electrically coupled to at least one of the top patterned metal layer and the bottom patterned metal layer, and a plurality of metal pillars including a first metal pillar electrically coupled between the first contact pad and the antenna, and wherein at least a first via of the plurality of filled vias is electrically coupled to the first metal pillar for providing a transmission line from the first contact pad to the antenna.

8. The method of claim 1, wherein the porous dielectric layer has an average porosity of at least 5% averaged over its thickness.

9. The method of claim 1, wherein the top dielectric layer is a porous layer including a plurality of pores and having an average porosity of at least 5% averaged over its thickness.

10. The method of claim 1, wherein the antenna includes a patch antenna.

11. The method of claim 1, wherein the antenna includes a Vivaldi antenna, a horn antenna, a Yagi-Uda antenna, or a bow-tie antenna.

12. The method of claim 1, wherein the multilayer package substrate further comprises a heat sink underneath the IC die.

13. The method of claim 12, wherein the multilayer package substrate further comprises a die attach material between the heat sink and the IC die.

14. The method of claim 1, wherein the substrate includes silicon.

15. The method of claim 4, wherein the epoxy material includes Ajinomoto build up film (ABF).

* * * * *